INVENTOR.
DONALD R. CARLEY
BY
W. S. Hill
AGENT

INVENTOR.
DONALD R. CARLEY
BY
W. B. Hill
AGENT

INVENTOR.
DONALD R. CARLEY
BY
W. S. Hill
AGENT

INVENTOR.
DONALD R. CARLEY
BY
W. S. Hill
AGENT

INVENTOR.
DONALD R. CARLEY
BY
W. S. Hill
AGENT

INVENTOR.
DONALD R. CARLEY

BY

W. S. Hill

AGENT

INVENTOR.
DONALD R. CARLEY
BY
W. S. Hill
AGENT

United States Patent Office 3,434,019

Patented Mar. 18, 1969

3,434,019

HIGH FREQUENCY HIGH POWER TRANSISTOR HAVING OVERLAY ELECTRODE

Donald R. Carley, Neshanic Station, N.J., assignor to Radio Corporation of America, a corporation of Delaware Filed Oct. 24, 1963, Ser. No. 318,678
U.S. Cl. 317—235 9 Claims
Int. Cl. H01l 13/00

Figure 1A:
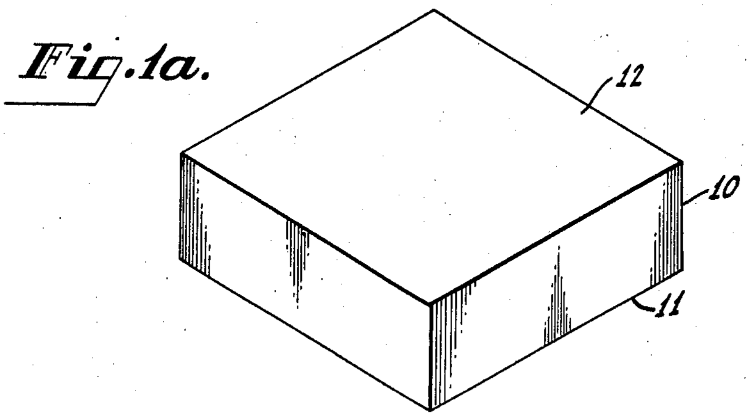

This invention relates to improved semiconductor devices, and improved methods of fabricating them.

It is known that the power output and power gain of semiconductor devices tends to decline as the operating frequency of the device increases. For this reason, semiconductor junction devices such as triode transistors are limited as to their power output at very high frequencies. It has hitherto been difficult to obtain transistors with an output as high as two watts at a frequency as high as two hundred and fitfy megacycles. Such units as are available in this frequnecy range are neither as uniform nor as reproducible in their electrical characteristics as is desirable, and are generally custom-made individually by techniques which are not compatible with mass production assembly line methods. For various purposes, such as telemetering applications and satellite communications, it is desirable to utilize semiconductor devices such as transistors having a power output of several watts at frequencies above two hundred and fifty megacycles. It is also desirable that improved high frequnecy high power devices be fabricated by processes that are compatible with mass production assembly line methods, so that large numbers of units which exhibit uniform and reproducible electrical characteristics can be inexpensively manufactured.

Accordingly, it is an object of this invention to provide improved semiconductor devices.

Another object of this invention is to provide improved semiconductor devices capable of operating at very high frequencies.

Still another object is to provide improved semiconductor devices capable of high power output at very high operating frequencies.

But another object is to provide improved methods of fabricating improved high frequency semiconductor devices.

Yet another object is to provide improved inexpensive methods of fabricating improved high frequency high output transistors.

But another object is to provide improved methods for mass producing improved high frequency high power transistors with uniform and reproducible electrical characteristics.

Figure 1B:
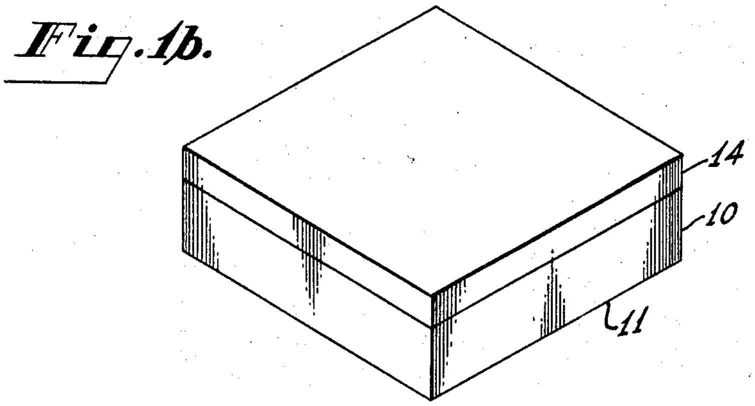
Figure 1C:
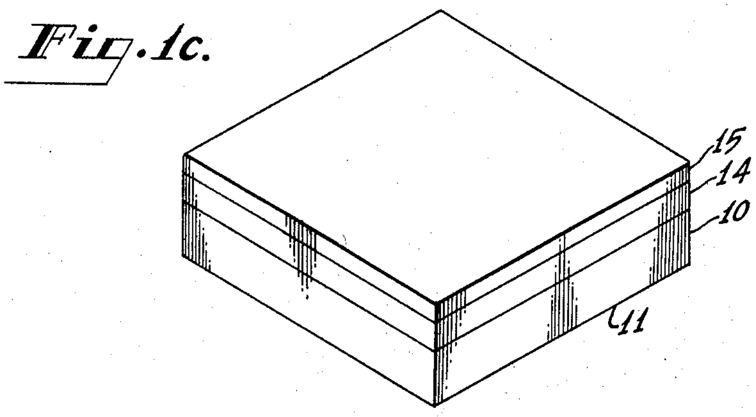
Figure 1D:
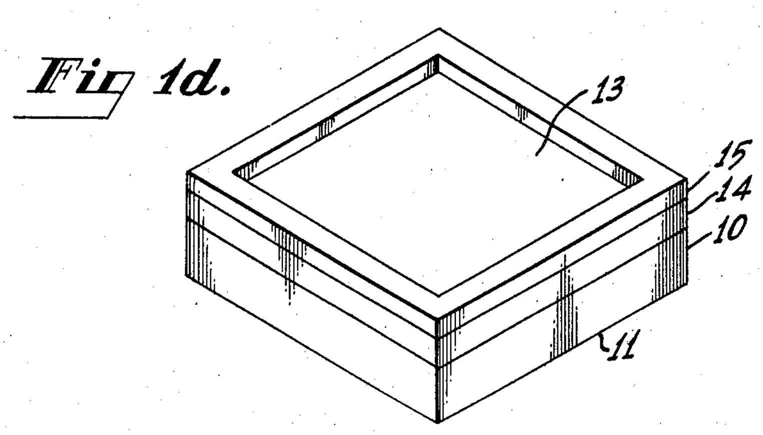
Figure 1E:
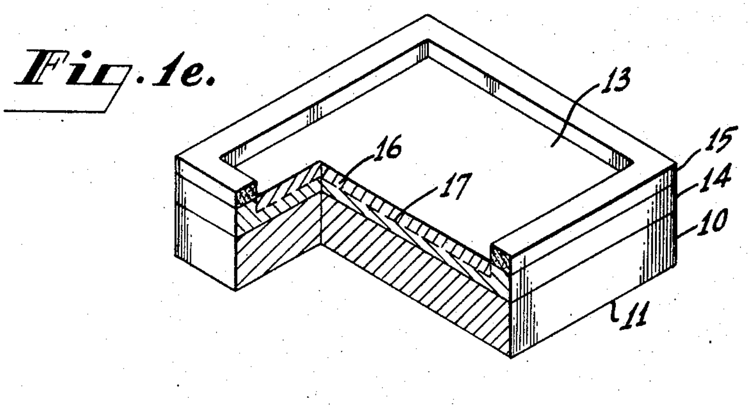
Figure 1F:
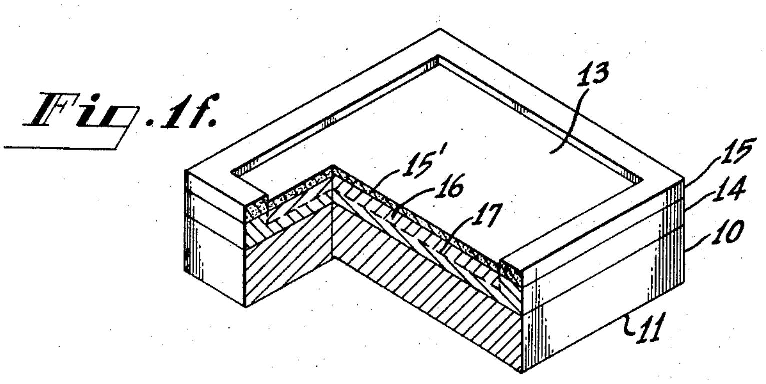
Figure 1G:
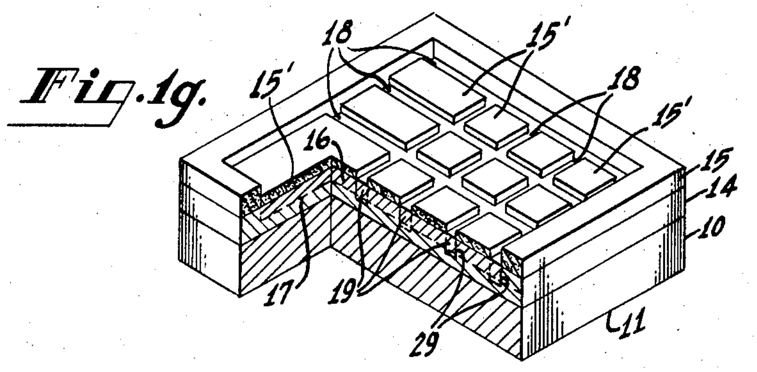
Figure 1H:
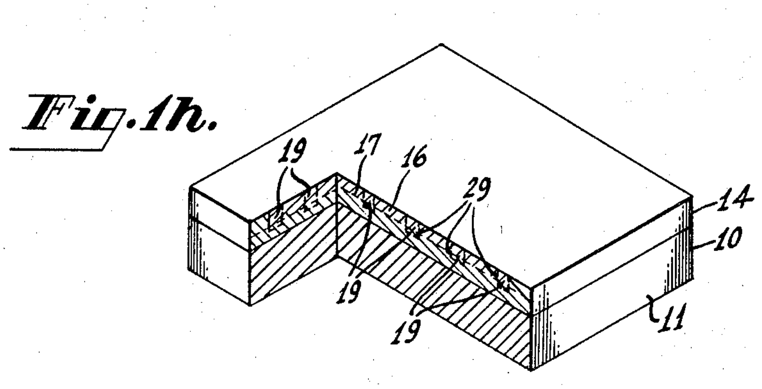
Figure 1J:
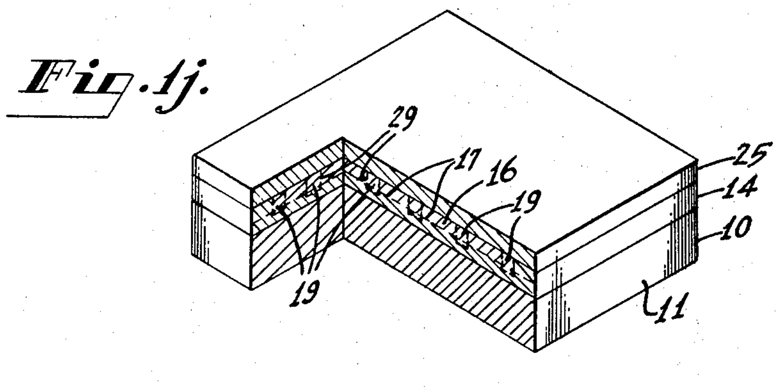
Figure 1K:
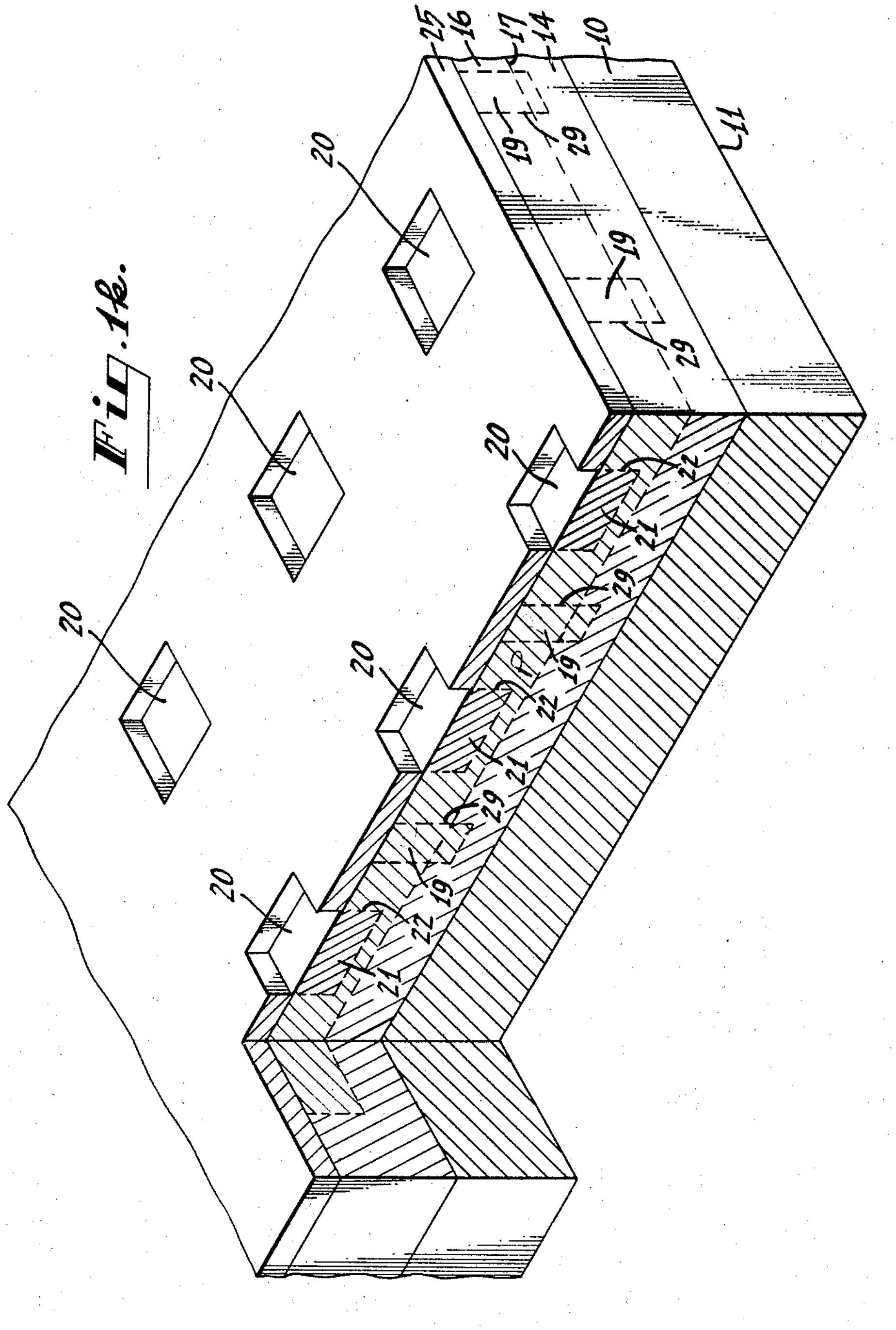
Figure 1E:
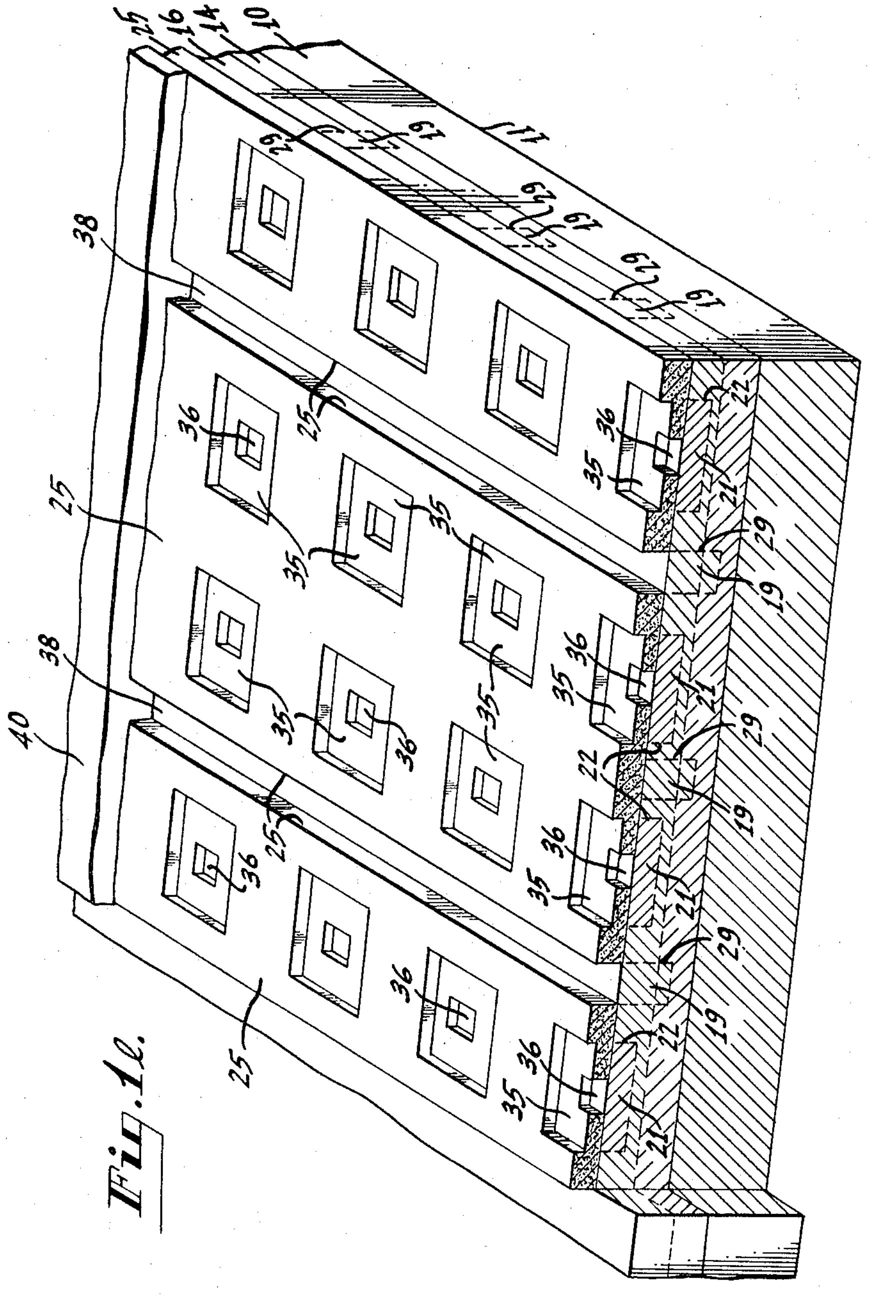

These and other objects of the invention are obtained by providing a semiconductor junction device such as a triode transistor having a plurality of discrete emitter regions. The surface area of each said emitter region is less thân one mil square. All the emitter regions are connected in parallel by a single metallic contact. A high ratio of the emiter periphery to the emitter area of the device is thus obtained. Another important feature of high frequency high power transistors according to the invention is the provision of a plurality of highly conductive paths within the base region of the device, preferably in the form of a regular array such as an X–Y grid. These conductive paths distribute the base current evenly throughout the base region, and reduce the base resistance ($r_{bb}'$) of the device. Other features and advantages of semiconductor junction devices according to the invention, and improved methods of mass producing them, will be described in greater detail by the following examples, considered in conjunction with the accompanying drawing, in which:

FIGURES 1*a*–1*l* are schematic isometric views of a semiconductor wafer during successive steps in the fabrication of a semiconductor device according to one embodiment of the invention, with FIGURES 1*k* and 1*l* being enlarged views of a portion of the wafer for greater clarity;

FIGURES 2*a*–2*d* are cross-sectional views of a wafer during successive steps in the fabrication of a semiconductor junction device according to another embodiment of the invention; and, FIGURES 3–6 are plan views of a semiconductive wafer during successive steps in the fabrication of a junction device according to the invention.

EXAMPLE I

A body such as a wafer or die 10 (FIGURE 1*a*) of crystalline semiconductive material such as germanium, silicon, germanium-silicon alloys, gallium arsenide, indium phosphide, and the like, is prepared with two opposing major faces 11 and 12. The exact size, shape, conductivity type, and composition of wafer 10 is not critical in the practice of the invention. Suitable, wafer 10 is about 45 mils square and 6 mils thick. In this example, wafer 10 consists of monocrystalline silicon heavily doped with a donor such as phosphorus so as to be of N type conductivity, and has a resistivity of about .005 ohm-cm. (equivalent to about $1.2 \times 10^{19}$ charge carriers per cm.$^3$).

A high resistivity region is formed adjacent one major wafer face by any convenient method, such as epitaxial deposition or diffusion techniques. In this embodiment, an epitaxial method is utilized.

An epitaxial silicon layer 14 (FIGURE 1*b*) is deposited on one wafer face 12 by any convenient technique known to the semiconductor art, for example, by passing a mixture of hydrogen and silicon chloride over the heated wafer. The epitaxial layer 14 thus grows as an extension of the crystal lattice of wafer 10. Epitaxial layer 14 is also of N type conductivity, and is advantageously about 1 mil thick. However, the resistivity of epitaxial layer 14 is greater than that of the wafer 10, and has a value in the range of about 1 to 15 ohm-cm.

An electrically insulating coating 15 is now deposited on the epitaxial layer 14 by any convenient method, such as evaporation. The insulating coating 15 may consist of silicon monoxide, silicon dioxide, magnesium fluoride, magnesium oxide, and the like. In this example, wherein the wafer consists of silicon, a suitable silicon oxide coating is conveniently formed by thermal oxidation of the wafer.

Wafer 10 is heated in steam for about 20 minutes at about 1200° C. so as to form a silicon oxide coating 15 (FIGURE 1*c*) over the epitaxial layer 14. The other wafer surfaces may be masked during this step to prevent deposition of an oxide coating thereon. Alternatively, the oxide coating may be formed over the entire wafer, and then selectively removed by grinding or lapping or masking and etching.

Referring now to FIGURE 1*d*, an opening 13 is made in the silicon oxide coating 15 on the epitaxial layer 14 by removing a predetermined internal portion thereof so as to expose an area 13 of the epitaxial layer 14. The exact size and shape of the exposed area 13 is not critical, and is suitably about 20 mils square. The predetermined portion of the silicon oxide coating is removed by any convenient method, such as lapping or grinding, or by masking portions of the oxide layer with an acid resist such as paraffin wax, apiezon wax, and the like, then removing the unmasked portions of the layer with an etchant such as hydrofluoric acid or ammonium fluoride solution. Alternatively, photolithographic masking methods may be utilized by coating the oxide layer with a photoresist, exposing the photoresist to a suitable light pattern, then polymerizing and hardening only those portions of the photoresist which were exposed to light, while removing the unexposed portions. The photoresist may consist of a bicromated protein such as bichromated alubumen, bichromated gum arabic, bichromated gelatin, and the like. Commercially available photoresists, such as KPR, manufactured by the Eastman Kodak Company; CFC, manufactured by the Clerkin Company; and Hot Top, manufactured by the Pitman Company, may also be utilized for this purpose.

Wafer 10 is next heated at about 1000° C. for about 25 minutes in an ambient containing nitrogen and a suitable acceptor, such as boron oxide ($B_2O_3$) vapors. A boron-diffused region 16 (FIGURE 1*e*) is thus formed in the portion of the epitaxial layer 14 which was exposed within the opening 13. Region 16 is about .02 mil thick, and is converted to P type conductivity by the boron diffused therein. At the same time, a p-n junction 17 is formed between the boron-diffused P type region 16 and the N type remainder of epitaxial layer 14. Junction 17 becomes the base-collector junction of the completed device.

Wafer 10 is then heated in an oxidizing ambient such as steam at about 1100° C. for about 45 minutes. Another silicon oxide coating 15' (FIGURE 1*f*) is thereby grown over the boron-diffused region 16. The second silicon oxide layer 15' is thinner than the first silicon oxide coating 15, which increases in thickness during this step. The boron-diffused base region 16 also becomes thicker (about 0.10 mil) during this heating step, since the boron atoms diffuse deeper into the epitaxial layer 14.

Figure 3:
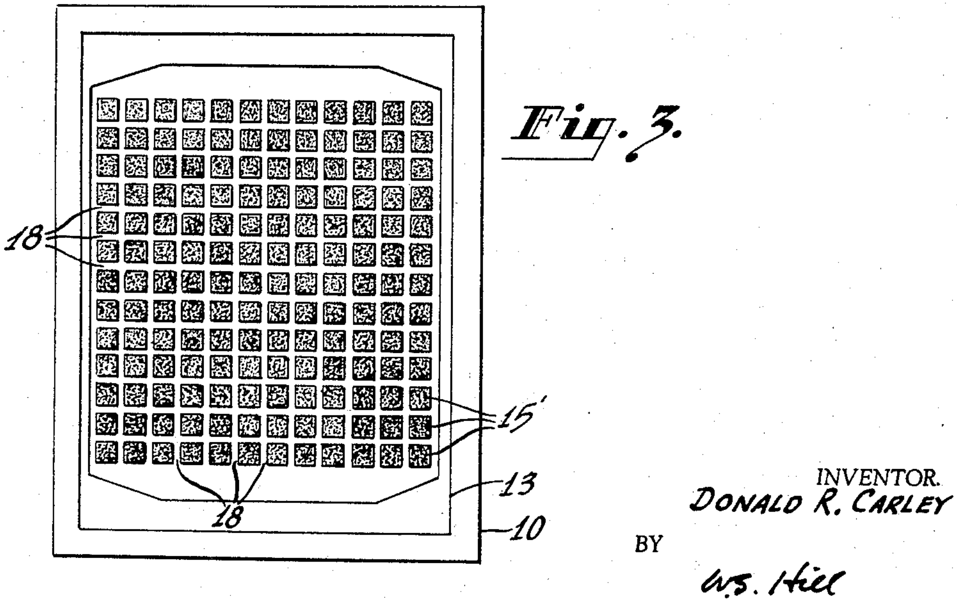

Utilizing the masking and etching techniques mentioned above, the silicon oxide coating 15' over the base region 16 is etched to form an array of channels 18 (FIGURE 1*g*). The precise size, shape, and exact number of channels 18 is not critical, and is adjusted to correspond to the number of emitter regions subsequently formed. Portions of the boron-diffused base region 16 are thus exposed by the array of channels 18. FIGURE 3 is a plan view of the semiconductive body 10 at this stage, showing the array of channels 18 in the silicon oxide coating 15'.

The wafer 10 is now reheated in a neutral ambient containing a vaporized acceptor. In this example, wafer 10 is reheated for about 15 minutes at about 1200° C. in a nitrogen ambient containing boron oxide vapors. Additional boron is thus diffused into the exposed portions of P type base region 16 to form $P^+$ zones 19 in a rectangular X–Y grid or array within the base region corresponding to the array of channels 18 in the silicon oxide coating 15'. Wafer zones 19 are about 0.3 mil wide in this example, and about 0.12 mil deep. Since the boron-diffused P type base region 16 is only about 0.10 mil thick, the $P^+$ zones 19 extend completely through the P type base region 16 and a short distance into the N type portion of epitaxial layer 14. The boundaries of the $P^+$ zones 19 are indicated by the dotted lines 29, which represent $P^+P$ interfaces in the P type base region 16, and $P^+N$ junctions in the N type portion of epitaxial layer 14 below the base-collector junction 17.

The conductive zones 19 are neither metal nor metal-semiconductor eutectic; they may be regarded as parts of the semiconductive base region which are more heavily doped than the remainder of the base region.

The resistivity of the $P^+$ zones 19 is considerably lower than the resistivity of the P type region 16. In this example, the sheet resistivity of base region 16 at the surface is about 80 ohms per square, while the sheet resistivity of the $P^+$ zones 19 at the surface is only about 4 ohms per square. The $P^+$ zones 19 thus serve as conductive paths for distributing current uniformly throughout the entire base region 16. The effective internal resistance between the rectifying emitter electrode and the nonrectifying base connection, known in hybrid-$\pi$ equivalent circuits as the base resistance $r_{bb'}$ of the device, is thereby decreased, and the high frequency response of the unit is correspondingly increased. The base current is not introduced into the collector junction 17. For a discussion of $r_{bb'}$ and other above the boundaries 29 are rectifying below the base-collector junction 17. For a discussion of $r_{bb'}$ and other parameters of hybrid-$\pi$ equivalent circuits, see L. J. Giacoletto, "Study of P-N-P Alloy Junction Transistors From D.C. Through Medium Frequency," RCA Review, vol. 15, No. 4, December 1954, pp. 506–562; see also L. J. Giacoletto, "Terminology and Equations for Linear Active Four-Terminal Networks Including Transistors," RCA Review, vol. 14, No. 1, March 1953, pp. 28–46. Since $r_{bb'}$ is one of the important parameters which limit the high frequency performance of such devices, the reduction of the base resistance of semiconductor devices is advantageous, particularly for devices intended to operate at frequencies above 100 megacycles.

Advantageously, the semiconductive wafer 10 is now treated with an etchant such as hydrofluoric acid so as to remove all of the remaining portions of silicon oxide layer 15 and 15', leaving wafer 10 as shown in FIGURE 1*h*. This step serves to remove some impurities, such as metal ions, which tend to accumulate at the interface between the silicon oxide and the semiconductor.

Wafer 10 is reheated at about 1000° C. in steam for about 50 minutes. A fresh, clean silicon oxide layer 25 (FIGURE 1*j*) is thus formed over the entire wafer.

Figure 4:
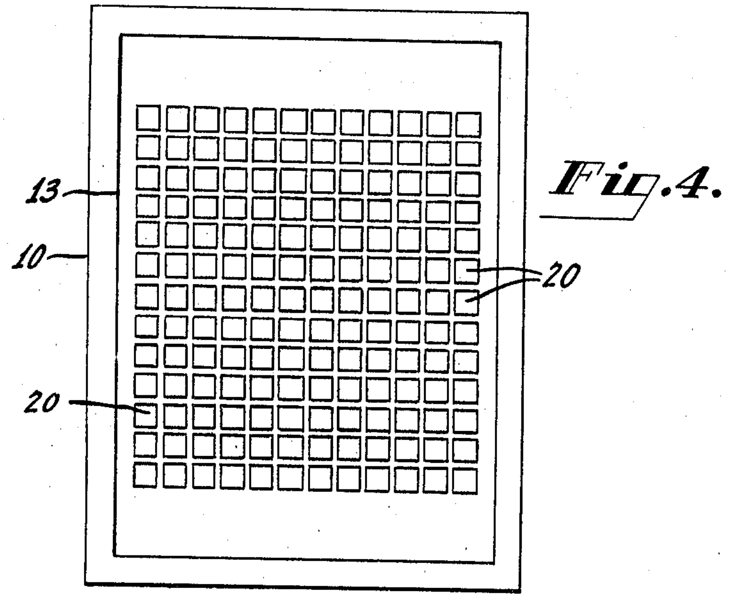

Referring now to FIGURE 1*k*, which for greater clarity is an enlarged fragmentary view showing only a portion of wafer 10, the fresh silicon oxide layer 25 is masked and etched to form a plurality of openings 20 in layer 25, thereby exposing portions of the P type boron-diffused base region 16. The openings 20 are arranged in a regular array, such as an X–Y grid, so that each opening 20 is within an area bounded by two orthogonal pairs of the conductive zones 19. The shape of each opening 20 is not critical, and may be either circular or triangular or rectangular, or even irregular. However, for best results at high frequencies, the area of each opening 20 should be less than 1 mil square. In this example, the openings 20 are square in shape; about 0.5 mil on edge; and arranged in a rectangular array of thirteen rows and twelve columns. FIGURE 4 is a plan view showing the array of openings 20 at this stage.

The wafer 10 is now heated in an ambient including a vaporized donor so as to convert the exposed portions of the boron-diffused region 16 to opposite type conductivity. In this example, wafer 10 is heated in an ambient including phosphorus pentoxide vapors for about two to ten minutes at about 1100° C. Portions 21 of the boron-diffused base region 16 are thus converted to N conductivity type, and serve as the emitter regions of the device. At the boundaries between the N type phosphorus-diffused emitter regions 21 and the P type boron-diffused base region 16 there are formed a plurality of p-n junctions 22. These are the emitter-base junctions of the device.

Figure 5:
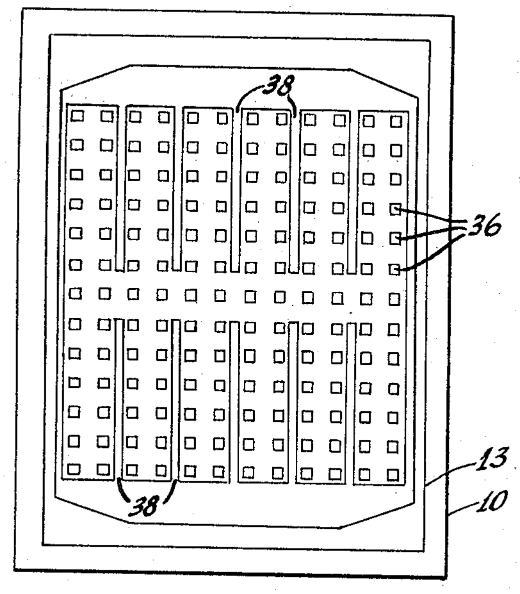
Figure 6:
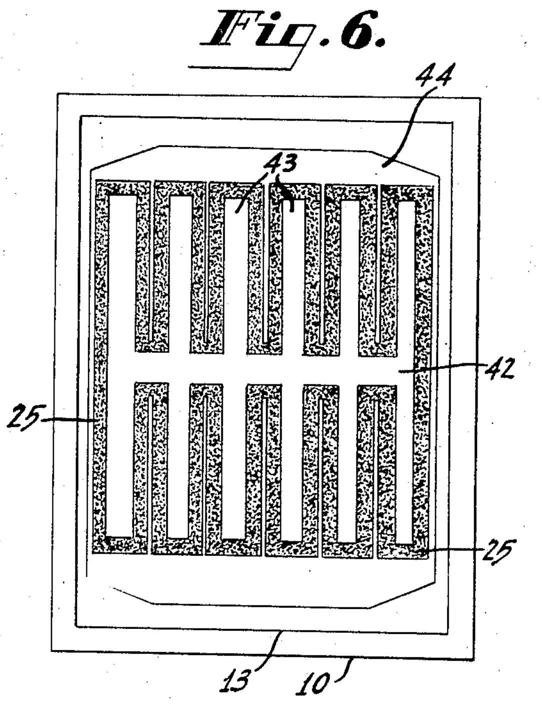

Wafer 10 is now reheated in steam for about 20 minutes at about 1000° C. to form a silicon oxide coating 35 (FIGURE 1*l*) over each emitter region 21. The silicon oxide coatings 35 are thinner than the silicon oxide coating 25, which increases in thickness during this step. Utilizing the masking and etching techniques mentioned above, an emitter contact opening 36 is made in the silicon oxide coating 35 over each emitter region 21. The exact size and shape of each emitter contact opening 36 is not critical, but each opening 36 should be entirely within the area of the corresponding emitter region 21 therebeneath. In this example, each emitter contact opening 36 is square, about 0.3 mil on edge, and centered within each corresponding emitter region 21, which, as previously mentioned, is a square 0.5 mil on edge. During the same etching step, portions of the silicon oxide coating 25 are removed to form an array of channels 38. The channels 38 are preferably as wide as the P+ conductive paths 19, that is, about 0.3 mil wide in this example, and are formed in a unidirectional array so that each channel 38 exposes alternate conductive paths 19 up to the central row of openings 36. FIGURE 5 is a plan view showing the array of emitter contact openings 36 and channels 38 at this stage.

A low resistance electrical contact is now made to exposed P+ conductive paths 19, and to the exposed portions of each emitter area 21 which corresponds to each opening 36. One method of accomplishing this is to deposit a metal or alloy over each of these exposed portions of wafer 10. In this example, a film 40 consisting of aluminum is deposited by evaporation over the entire surface of the wafer. The exact thickness of film 40 is not critical, and is conveniently about 0.15 mil thick. The conductive film 40 does not make contact to the entire base region 16, since part of the film overlies the silicon oxide coatings 25 and 35. The film 40 does make contact to the exposed portions of wafer 10 which correspond to the exposed conductive paths 19 beneath channels 38, and the contact areas 36 within each emitter region 21. Although aluminum is an acceptor in silicon, it has been found that aluminum makes a low resistance contact to both the boron-diffused P+ type conductive paths 19 and the phosphorus-diffused N type emitter regions 21. When the metallic film 40 is less than a mil thick, as in this example, the pattern or array of conductive paths and emitter openings is visible as indentations in the metallic film.

Since the metallic contact film 40, as first deposited, makes a single contact to both the base region of the device and the plurality of emitter regions, the film 40 is divided into two separate portions, one of which contacts only the base region of the device, while the other contacts only the emitter region of the device. Such subdivision of metallic contact 40 is conveniently accomplished by depositing a layer of photoresist (not shown) over metallic film 40, and exposing the photoresist to a suitable light pattern, developing the photoresist, and removing the unmasked portions of the metallic film 40 by means of an etchant so as to expose portions of silicon oxide layer 25 therebeneath. In this example, wherein the metallic film 40 consists of aluminum, the unmasked portions of film 40 are conveniently removed by etching in a bath consisting of an aqueous sodium hydroxide solution. Advantageously, the contact film is thus divided into two parts, as shown in the plan view of FIGURE 6; a central portion 42 which becomes the emitter contact, and a peripheral portion 44 which becomes the base contact of the device. Contacts 42 and 44 are electrically insulated from each other by the exposed portion of the silicon oxide layer 25 between them. The emitter contact 42 preferably has an interdigitated or comblike structure consisting of a plurality of fingers 43. In this example, each finger 43 covers two adjoining columns of the emitter contact areas. Since in this example the array of emitter regions consisted of twelve columns, there are six fingers in the emitter contact 42. The base contact 44 extends from the periphery of the base region to the narrow areas between the fingers 43, so as to make contact with every alternate conductive path 19 (not shown in plan view) between the fingers. The base current is thus distributed evenly and with low resistance loss throughout the entire P type base region 16 by means of the X–Y grid of P+ high conductivity paths 19. The array of conductive paths 19 in the base region of the device thus reduces the electrical parameter known as base resistance ($r_{bb'}$), and hence is an important factor in achieving high frequency performance in the completed unit.

The N type bulk of epitaxial layer 14 is the collector region of the completed device. Since in this example, the epitaxial layer 14 has been grown on a wafer 10 which is also of N type conductivity, an electrical contact to the collector region 14 may be made by soldering a lead wire to face 11 of wafer 10. Alternatively, the wafer 10 is mounted in an enclosure such as a metallic can by bonding wafer face 11 to the bottom of the can, which then serves as a collector lead to the device. At least one emitter lead wire (not shown) is then bonded to emitter contact 42 and at least one base lead wire (not shown) is bonded to base contact 44 by any convenient method, such as thermocompression bonding or soldering. The steps of attaching lead wires, and encapsulating and casing the device, are accomplished by standard techniques of the semiconductor art, and need not be described here.

The device described has a high ratio of emitter periphery (in mils) to emitter area (in square mils). It is known that emitter injection current is improved by increasing the emitter periphery, since the emitter current passes from the emitter region to the base region by way of the emitter periphery. However, while the power output of a device may thus be increased by increasing the emitter area and the emitter periphery, the increase in emitter area increases the emitter capacitance, and hence decreases the high frequency performance of the device. It is therefore desirable when fabricating high frequency transistors to increase the emitter periphery without unduly increasing the emitter area. Hitherto this has been accomplished by making an emitter region in the shape of a leaf, or in some regular shape with a plurality of lobes. While some improvement in the ratio of emitter periphery to emitter area has thus been obtained, the ratio is still less than is desirable for high power high frequency devices. In the devices described herein, the ratio of emitter periphery to emitter area is considerably increased by subdividing the emitter into a plurality of emitter regions, each region having an area less than one mil square. Consider, for example, prior art devices such as mesa transistors and the like in which the emitter region is generally rectangular in shape. The specific dimensions of the emitter region in such devices of the prior art will vary, but may, for example, appropriately be two mils by twenty mils. The emitter area of this prior art device is thus forty square mils, while the emitter periphery is forty-four mils. The ratio of the number of units of emitter periphery length $l$ (forty-four mils in this example) to the number of units of emitter area $l^2$ (forty square mils in this example) is only a little greater than one. In contrast, in the device of this embodiment of the invention, there are 156 emitter regions, each region being a square 0.5 mil on edge. The total emitter area in the device of this embodiment is thus thirty-nine square mils, which is a little less than the emitter area of the prior art device, while the total emitter periphery of the device of this embodiment is three hundred and twelve mils, making the ratio of the number of units (mils) of emitter periphery to the number of units (square mils) of emitter area exactly eight in the device of this example. It will be seen that this significant improvement in the emitter periphery-emitter area ratio will not be much impaired if the array of emitter regions in the device according to the invention is given some other shape, such as a triangle, or a circle, or an irregular shape, as long as the area of each individual emitter region is less than one mil square. A feature of the devices according to the invention is that the emitter periphery to emitter area ratio is made greater than six, thereby increasing the high frequency high power performance of the device.

EXAMPLE II

In the above example, a semiconductive wafer or slice having an epitaxial layer on one major face was utilized to fabricate the device. In this example, a semiconductor junction device is fabricated by diffusion methods throughout, without the necessity of growing an epitaxial layer.

A wafer or die 50 (FIGURE 2*a*) of crystalline semiconductive material is prepared with two opening major faces 51 and 52. The exact size and shape and composition of wafer 50 is not critical. In this example, wafer 50 is about 45 mils square, 15 mils thick, and consists of monocrystalline silicon. Wafer 50 may be of either conductivity type. In this example, wafer 50 is of N type conductivity, and has a resistivity value in the range of about 1 to 15 ohm-cm.

Wafer 50 is heated in an ambient containing a conductivity modifier which is the same type as that of the wafer. In this example, wafer 50 is heated in an ambient containing phosphorus pentoxide vapors for about 30 minutes at about 1250° C., so as to form a phosphorus-diffused $N^+$ surface zone 53 (FIGURE 2*b*) around a central N type portion 45 of the wafer. Under these conditions, the surface zone 53 is about 5 mils thick, and has a surface concentration of about $1 \times 10^{20}$ phosphorus atoms per $cm.^3$.

Figure 2A:
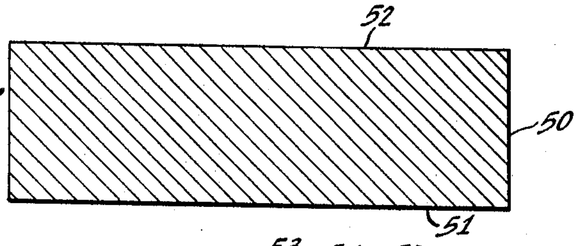
Figure 2B:
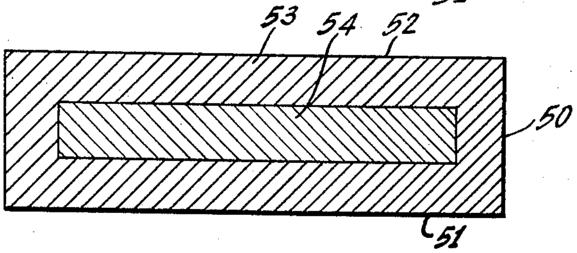
Figure 2C:
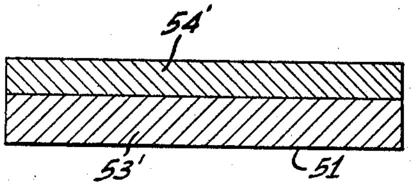

The ends of the wafer are removed by cutting, and the wafer is now lapped down from one major face 52 so as to remove the entire $N^+$ surface zone on that side, and also remove a portion of the central N type region 54, leaving the remainder of the wafer 50' as shown in FIGURE 2*c*, with an $N^+$ zone 53' about 5 mils thick adjacent face 51, and an N type zone or portion 54' about 1.6 mils thick. Advantageously, the lapping step is conducted so that the face of wafer 50' opposite major face 51 is optically flat, thus obtaining greater control of the thickness of wafer 50' and of the diffused regions subsequently formed therein.

Wafer face 51 is masked, and wafer 50' is treated in a suitable etchant to remove about 0.6 mil of the wafer thickness from the unmasked face. This step removes the work-damaged portion of the wafer, and exposes a fresh, clean surface for processing. The mask is now removed, and an insulating layer 55 of material such as silicon oxide is now deposited on the face of wafer 50' opposite major face 51, leaving wafer 50' as in FIGURE 2*d*, with an $N^+$ region 53' about 5 mils thick adjacent wafer face 51, and an N type region 54" about 1.0 mil thick.

The wafer 50' thus prepared consists of a thin N type layer or region over a thicker region of $N^+$ type, and is thus similar to the configuration of the semiconductor wafer in FIGURE 1*b* in Example I. The subsequent steps of diffusing a base region into N type zone 54', diffusing a grid of conductive paths within the base region, diffusing a plurality of emitter regions within the base region, the area of each emitter region being less than one mil square, and forming metallic contacts to the base region and the emitter regions, are accomplished by techniques similar to those described above in Example I.

Alternatively, a given conductivity type crystalline semiconductive wafer may be masked on one major face, and a conductivity modifier of the same type diffused into the unmasked major face, thereby forming a wafer with a given conductivity type high resistivity region adjacent one major face, and a low resistivity region adjacent the opposing major wafer face. The subsequent steps of forming a base region, conductive paths in the base region, and an array of discrete emitter regions, are performed as described above.

EXAMPLE III

Figure 2D:
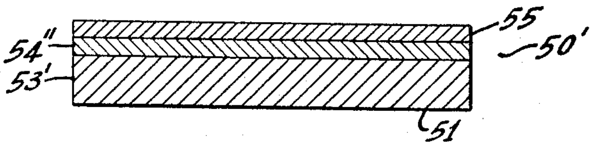

In this example, a crystalline semiconductive wafer comprising a thin zone or sheet of given conductivity type over a thicker zone or sheet of the same conductivity type but lower resistivity is prepared as shown in FIGURE 1*b* of Example I by epitaxial growth, or by diffusion, as in FIGURE 2*d* of Example II. The face of the thin region of the wafer is then suitably masked, and a conductivity modifier or opposite conductivity type is diffused into the thin given type zone so as to form a rectangular grid of conductive paths of opposite conductivity type, such as the X–Y array of conductive paths 19 in FIGURE 1*g*. An opposite conductivity type base region 16 in FIGURE 19*g*. is then diffused into the thin zone of the wafer around the aforesaid grid of conductive paths. During this second diffusion step the conductivity of the grid of conductive paths in increased.

An important advantage of this method is that the first diffusion step, which forms the grid of conductive paths, may be conducted at elevated temperatures with concentrated impurity (conductivity modifier) sources, so as to make the conductive paths very heavily doped, and hence of very low electrical resistance. This step can be performed without affecting the conductivity of the base region, which is formed subsequently. In the method of this example, the conductivity of the X–Y grid in the base region is greater than the conductivity of the X–Y grid in Examples I and II above. The base resistance $r_{bb}{}^1$ of the device is thereby reduced and the base current more efficiently distributed to the emitter regions. The subsequent steps of forming a plurality of emitter regions, each less than one mil square, within the base region, and forming electrical contacts to the base region and the emitter regions, may be accomplished as described above in Example I.

Transistors fabricated with an array or grid of conductive paths within the base region, and a plurality of emitter regions, each emitter region having a surface area less than one mil square, and an emitter periphery to emitter area ratio greater than six, have exhibited a power output as high as six watts at operating frequencies as high as 500 megacycles. Transistors with such high power outputs at frequencies above 250 megacycles have not hitherto been reported.

While the above embodiments have been described in terms of an NPN silicon transistor, it will be appreciated that this is by way of example only, and not limitation. The conductivity type of the various regions may be reversed, so as to fabricate PNP devices. Other crystalline semiconductors, such as germanium, indium phosphide, and the like, may be utilized with other appropriate acceptors and donors. The metallic conductive film may consist of metals other than aluminum, for example, one of the noble metals such as gold, and may be deposited on the crystalline semiconductor wafer or slice by other methods, such as electroless plating, electroplating, and the like. The formation of the insulating layers may be accomplished by other techniques, such as evaporation. When the insulating layers consist of silicon oxide thermally grown on a silicon wafer, they may be formed simultaneously with the diffusion steps. When the semiconductive wafer consists of materials other than silicon, such as germanium, gallium arsenide, and the like, insulating layers of silicon oxide may be deposited thereon by thermal decomposition of siloxane compounds, as described in U.S. Patent 3,089,793, issued May 14, 1963 to Jordan and Donahue, and assigned to the assignee of this application. The array of conductive zones in the base region of the devices may run in one direction only, for example between the columns of emitter regions; alternatively, the array may consist of a nonorthogonal or irregular grid. Although device fabrication has been described for greater clarity in terms of a single unit made from a single wafer or die, in practice a hundred or more units may inexpensively be processed simultaneously on a slice of a crystalline semiconductive ingot, and then subdivided into separate units having uniform and reproducible electrical characteristics. Various other modifications may be made by those skilled in the art without departing from the spirit and scope of the invention as defined in the specification and the appended claims.

What is claimed is:

1. A transistor comprising a crystalline semiconductive body, an electrically insulating coating on one surface of said body;

a plurality of discrete given conductivity type emitter regions in said body at said surface thereof;

a collector region of said given conductivity type in said body;
an opposite conductivity type base region in said body between said emitter and collector regions;
a plurality of conductive zones in said base region adjacent said surface, said zones being of said opposite conductivity type but of substantially lower resistivity than the remainder of said base region, said zones being disposed between and spaced from said emitter regions;
conductive means on said insulating coating interconnecting said emitter regions and overlying said base region and some of said conductive zones but separated therefrom by said insulating coatings; and
an electrical connection to said zones, said connection including an array of contacts, said contact array extending over a portion of said surface.

2. A transistor comprising a crystalline semiconductive body as in claim 1, wherein said conductive zones in said base region form a regular array.

3. A transistor comprising a crystalline semiconductive body as in claim 1, wherein said conductive zones in said base region form an orthogonal array.

4. A transistor comprising a crystalline semiconductive body as in claim 1, wherein each of said discrete emitter regions has an area less than one square mil.

5. A transistor comprising a crystalline semiconductive body having a major face;
an electrically insulating coating on said major face;
a plurality of discrete given conductivity type emitter regions in said body immediately adjacent said major face, the area of each said emitter region being less than one square mil;
a given conductivity type collector region in said body;
an opposite conductivity type base region in said body between said emitter and collector regions;
a plurality of conductive zones in said base region immediately adjacent said major face, said zones being of said opposite type but of lower resistivity than the remainder of said base region, said zones being disposed between and spaced from said emitter regions;
a single emitter contact connecting all of said emitter regions, said emitter contact overlying alternate ones of said conductive zones but spaced therefrom by said insulating coating; and
an electrical connection to the remaining ones of said zones.

6. A transistor comprising a crystalline semiconductive body having a major face;
an electrically insulating coating on said major face;
a given conductivity type collector region in said body;
an opposite conductivity type base region in said body between said major face and said collector region;
an orthogonal array of conductive zones in said base region immediately adjacent said major face, said zones being of said opposite type conductivity but of lower resistivity than the remainder of said base region;
a regular array of discrete given conductivity type emitter regions in said base region immediately adjacent said major face, the area of each said emitter region being less than one square mil, said emitter regions being deposited between and spaced from said conductive zones;
a single emitter contact connecting all of said emitter regions, said contact overlying alternate ones of said conductive zones but separated therefrom by said insulating coating; and
an electrical connection to the remaining ones of said zones, said connection consisting of an array of contacts, said contact array extending over a portion of said face.

7. A transistor comprising a given conductivity type crystalline semiconductive body having at least one major face;
an opposite conductivity type base region adjacent said one major face;
an array of conductive zones in said base region immediately adjacent said major face, said zones being of said opposite conductivity type but of lower resistivity than the remainder of said base region;
a plurality of discrete given conductivity type emitter regions in those portions only of said base region between said conductive zones, said emitter regions being immediately adjacent said major face and spaced from said conductive zones;
an electrically insulating coating over said one major face;
an electrically conductive metal film in overall contact with alternate ones of said conductive base zones; and
an electrically conductive metal film overlying said base region and the remainder of said conductive zones but separated therefrom by said insulating coating and making contact with said emitter regions only.

8. A transistor structure suitable for incorporation within an integrated circuit comprising: emitter, base and collector regions of which said base region is of opposite semiconductivity type to said emitter and collector regions forming junctions therewith that terminate at a planar surface; said base region comprising first and second portions of which said first portion has a resistivity at least an order of magnitude less than that of said second portion, said first portion having a plurality of integrally joined segments enclosing said second portion in directions parallel with said surface to define a plurality of segments within said second portion at least partially separated by said first portion, said first portion also extending a greater distance from said surface than said second portion; said emitter region being disposed in said second portion of said base region and also having a plurality of segments at least partially separated by said first portion of said base region; ohmic contacts to each of said emitter, base and collector regions, said base contact being disposed only on said first portion of said base region.

9. The subject matter of claim 8 wherein: said collector region comprises a first portion spaced from said second portion of said base region that has a resistivity at least an order of magnitude less than that of a second portion of said collector region adjacent said second portion of said base region.

References Cited

UNITED STATES PATENTS

| | | | |
|---|---|---|---|
| 2,924,760 | 2/1960 | Herlet | 317—235 |
| 3,044,147 | 7/1962 | Armstrong | 29—25.3 |
| 3,046,405 | 7/1962 | Emeis | 250—211 |
| 3,144,366 | 8/1964 | Rideout | 148—179 |
| 3,174,112 | 3/1965 | Stelmak | 330—37 |
| 3,176,192 | 3/1965 | Sever | 317—101 |
| 3,183,128 | 5/1965 | Leistiko | 148—186 |
| 3,191,070 | 6/1965 | Jones | 307—88.5 |
| 3,210,620 | 10/1965 | Lin | 317—234 |
| 3,214,652 | 10/1965 | Knowles | 317—235 |
| 3,223,904 | 12/1965 | Warner | 317—235 |
| 3,226,611 | 12/1965 | Haenichen | 317—234 |
| 3,226,614 | 12/1965 | Haenichen | 317—234 |

JOHN W. HUCKERT, *Primary Examiner.*

M. EDLOW, *Assistant Examiner.*

U.S. Cl. X.R.

317—234; 307—88.5; 29—155.5

UNITED STATES PATENT OFFICE
CERTIFICATE OF CORRECTION

Patent No. 3,434,019 March 18, 1969

Donald R. Carley

It is certified that error appears in the above identified patent and that said Letters Patent are hereby corrected as shown below:

Column 4, lines 5 to 8, cancel "The base current is not introduced into the collector junction 17. For a discussion of $r_{bb'}$ and other above the boundaries 29 are rectifying below the base-collector junction 17." and insert -- The base current is not introduced into the collector region of epitaxial layer 14, since as mentioned above the boundaries 29 are rectifying below the base-collector junction 17. --. Column 7, line 1, "opening" should read -- opposing --. Column 8, before line 1 insert -- region, such as the base -- line 15, "$r_{bb}1$" should read -- $r_{bb'}$ --. Column 10, line 60, "Sever" should -- Sueur et al. --; under line 66 insert:

3,229,119 1/1966 Bohn et al. ------- 307-88.5

Signed and sealed this 7th day of April 1970.

(SEAL)
Attest:

Edward M. Fletcher, Jr.
Attesting Officer

WILLIAM E. SCHUYLER, JR.
Commissioner of Patents